United States Patent [19]
Chen et al.

[11] Patent Number: 5,559,764
[45] Date of Patent: Sep. 24, 1996

[54] HMC: A HYBRID MIRROR-AND-CHAINED DATA REPLICATION METHOD TO SUPPORT HIGH DATA AVAILABILITY FOR DISK ARRAYS

[75] Inventors: Ming-Syan Chen; Hui-I Hsiao, both of Yorktown Heights; Chung-Shen Li, Ossining; Philip S. Yu, Chappaqua, all of N.Y.

[73] Assignee: International Business Machines Corporation, Armonk, N.Y.

[21] Appl. No.: 292,640

[22] Filed: Aug. 18, 1994

[51] Int. Cl.⁶ ................................................. G11B 17/22
[52] U.S. Cl. .................................. 369/30; 369/48; 369/58
[58] Field of Search .................................. 369/32, 30, 48, 369/54, 58, 59, 47, 127, 34, 49; 360/72.1, 72.2

[56] References Cited

U.S. PATENT DOCUMENTS 5,442,611  8/1995  Hosaka ....................................... 369/48

FOREIGN PATENT DOCUMENTS

A0469924  2/1992  European Pat. Off. .

OTHER PUBLICATIONS

Solworth et al. "Distorted Mapping Techniques to Achieve High Performance in Mirrored . . . " Distributed & Parallel Databases, vol. 1, No. 1, Jan., 1993, pp. 81–102.

Orji et al. "Doubly Distorted Mirrors", Sigmod Record, vol. 22, No. 2, Jun., 1993 pp. 307–318.

Hsiao et al. "Chained Declustering: A New Availability Strategy for Multiprocessor . . . " 6TH Int. Conf. on Data Engineering, Feb. 5, 1990, pp. 456–465.

Ghandeharizadeh et al. "Continuous Retrieval of Multimedia Data Using Parallelism" IEEE Trans. on Knowledge & Data Engineering, vol. 5, No. 4, Aug., 1993.

"Optimal Data Allotment to Build High Availability & High Performance Disk Arrays", IBM Technical Disclosure Bulletin, vol. 37, No. 5, May, 1994, pp. 75–79.

Keeton et al., "The Evaluation of Video Layout Strategies on a High–Bandwidth File Server" Proc. Network & Operating System Support for Digital Audio & Video, Nov. 3, 1993, pp. 228–239.

Li et al., "Combining Replication & Parity Approaches for Fault–Tolerant Disk Arrays", Proc. 6th IEEE Symposium on Parallel & Distributed Processing, Oct. 26, 1994, pp. 360–367.

*Primary Examiner*—Ali Neyzari
*Attorney, Agent, or Firm*—Richard M. Ludwin

[57] ABSTRACT

A method of distributing a set of data among a plurality of disks, which provides for load balancing in the event of a disk failure. In accordance with the method the total number of the disks in an array are divided into a number of clusters. The blocks of data are then stored in each cluster such that each cluster contains a complete set of the data and such that data block placement in each cluster is a unique permutation of the data block placement in the other clusters. In the event of a disk failure, data block accesses to the failed disk are redirected to a disk in the other cluster having a copy of the data block and further access to the disks that remain operational are rebalanced.

7 Claims, 4 Drawing Sheets

FIG. 4

| Disk  | 0       | 1*   | 2       | 3       | 4       | 5       | 6       | 7       |
|-------|---------|------|---------|---------|---------|---------|---------|---------|
| d0-d3 | 28.6%d0 | 0%d1 | 85.7%d2 | 57.1%d3 | 71.4%d0 | 100%d1  | 14.3%d2 | 42.9%d3 |
| d4-d7 | 85.7%d4 | 0%d2 | 28.6%d6 | 57.1%d7 | 42.9%d7 | 14.3%d4 | 100%d5  | 71.4%d6 |

\* Disk Failed

HMC: A HYBRID MIRROR-AND-CHAINED DATA REPLICATION METHOD TO SUPPORT HIGH DATA AVAILABILITY FOR DISK ARRAYS

BACKGROUND OF THE INVENTION

1. Field of the Invention

The present invention relates to the data replication methods which provide high data availability for disk arrays.

2. Related Art

Recent advances on multimedia technologies have led to the creation of several new application in both information providing services and the entertainment business. Given the extremely large data size, one of the major challenges in the handling of multimedia data is to support very high disk bandwidth for video data retrieval. For example, the displaying HDTV quality image may require data rate of 2–3 Mbyte per second (after compression). In general, it is very undesirable to store such a large video in a single disk for the following reasons: First, a 100-minute HDTV movie will require more than 12-Gbyte storage. Such a large disk is usually expensive. Second, playing a hot (i.e., frequently requested) movie by a single disk will cause performance bottleneck. In fact, even for playing ordinary MPEG movies, the need to support multiple video streams by a video server also calls for the use of disk-arrays. Consequently, it is highly desirable to use disk arrays to handle the storage and retrieval of multimedia data.

Various studies have been conducted to evaluate and to enhance the performance of disk arrays. The issue of data availability assumes an even greater importance for real-time applications such as video-on-demand (VOD). However, as the number of disks used in the a disk array increases, the probability of disk failures increases. It has been projected that the average disk array installation in a VOD system will have 50,000 drives, each of which has a capacity of 200 MB, by the year of 2000. With 1000 installations, the projected mean-time-to-data-loss (MTTDL) is approximately 460 hours, or just 20 days. As a result, it has become necessary to devise effective methods to recover from disk failures on-line for the high data availability required for years to come. The replication approach, which stores multiple copies of data in different disks, is generally preferable for real-time applications to achieve fault-tolerance. In a VOD environment, usually most of the requests are for a small number of hot videos. Hence, the replication approach is used to selectively replicate the hot videos so that the service rate can be maintained upon disk failures.

There have been a number of prior art techniques proposed to explore the replication approach. These techniques differ in their ability to handle access skew, to service multiple request sizes, and to redistribute workload after failures. Basically, there are two data declustering techniques: mirrored declustering and chained declustering.

In mirrored declustering, the disks are organized into a set of identical pairs. The mirrored declustering strategy allows for the spreading of relations over multiple disks, while maintaining the mirrored disk tuples. In accordance with generalized mirrored declustering, in a cluster of m disks numbered 0, 1, . . . , m−1, the $i^{th}$ partition of $j^{th}$ replica ($i \leq j \leq r$) is placed on disk (i mod n)+(j−1) * n. An illustrative example is given in Table 1, where the data blocks are labeled d0–d7, r=2, n=4 and the number of disks in the disk array is m=8.

TABLE 1

| A double redundant disk array with mirrored declustering | | | | | | | | |
|---|---|---|---|---|---|---|---|---|
| Disk | 0 | 1 | 2 | 3 | 4 | 5 | 6 | 7 |
| d0–d3 | d0 | d1 | d2 | d3 | d0 | d1 | d2 | d3 |
| d4–d7 | d4 | d5 | d6 | d7 | d4 | d5 | d6 | d7 |

In chained declustering, the primary data copy in disk i has a backup copy in disk (i+1) mod n, where n is the number of disks in the disk array. Note that the cluster size for data placement in the chained declustering could be different from the disk array size, and explicitly, is only required to be a sub-multiple of the disk array size. A disk array based on chained declustering with the cluster size equal to 4 is shown in Table 2.

TABLE 2

| Chained declustering disk array with double redundancy | | | | | | | | |
|---|---|---|---|---|---|---|---|---|
| Disk | 0 | 1 | 2 | 3 | 4 | 5 | 6 | 7 |
| 1st Copy | d0 | d1 | d2 | d3 | d4 | d5 | d6 | d7 |
| 2nd Copy | d3 | d0 | d1 | d2 | d7 | d4 | d5 | d6 |

In the presence of disk failures, the chained declustering method is able to achieve better fault-tolerance and load balancing than the mirrored declustering method. On the other hand, the latter method has better flexibility than the former in dynamically adding or dropping data copies. Note that in some real-time applications such as VOD, the number of copies stored for a video (e.g. a movie) will change as the demand for the video changes. Chained declustering, under which adding/dropping data copies requires interrupting on-line execution, is thus unfavorable for such applications.

SUMMARY OF THE INVENTION

In light of the above, it is an object of this invention to combine the merits of both mirrored declustering and chained declustering into an improved desclustering method (hereinafter referred to as hybrid mirrored-and-chained declustering or HMC) in order to achieve better load balancing and fault-tolerance than either of the original methods.

In accordance with the method, the total number of disks available is first divided into r clusters, termed chained clusters, where r is the number of replicas required. Each replica is then declustered (partitioned) over the disks within each chain cluster. Each chain cluster as a whole stores identical data just as in mirrored declustering. However, the contents of each individual disk in different clusters are not the same.

In a preferred embodiment, the data declustering strategy is formulated as follows. Given a set of m disks numbered 0, 1, 2, . . . , m−1, where n is the size (number of disks) of a cluster, r is the number of replicas (and therefore the number of clusters), the $i^{th}$ partition of the $j^{th}$ replica is placed on the disk numbered D(i,j), where $$D(i,j)=(i+[i/n] * (j-1)) \bmod n+(j-1) * n.$$

Advantageously, HMC possesses better load balancing and fault-tolerance as a whole than either mirrored or chained declustering method. Further, in contrast to chained declustering, HMC allows replica and disks to be added on-line without having to move data in the existing copy around and without affecting the disk arm movement on existing disks. Consequently, users can incrementally add I/O capacity, I/O bandwidth, and the number of replicas without affecting existing services. This feature of HMC can very useful when the disk array is used as a video server.

These, and other objects, features and advantages of this invention will become apparent from the following detailed description of the invention taken in conjunction with the accompanying drawings.

BRIEF DESCRIPTION OF THE DRAWING

FIG. 4 shows the load distribution for hybrid mirrored-and-chained declustering when disk 1 fails; and, FIG. 5 is a flow chart of disk failure recovery by a controller in a hybrid mirrored-and-chained system.

Like numbered reference numerals appearing in more than one figure represent like elements.

DETAILED DESCRIPTION OF A PREFERRED EMBODIMENT

Figure 1:
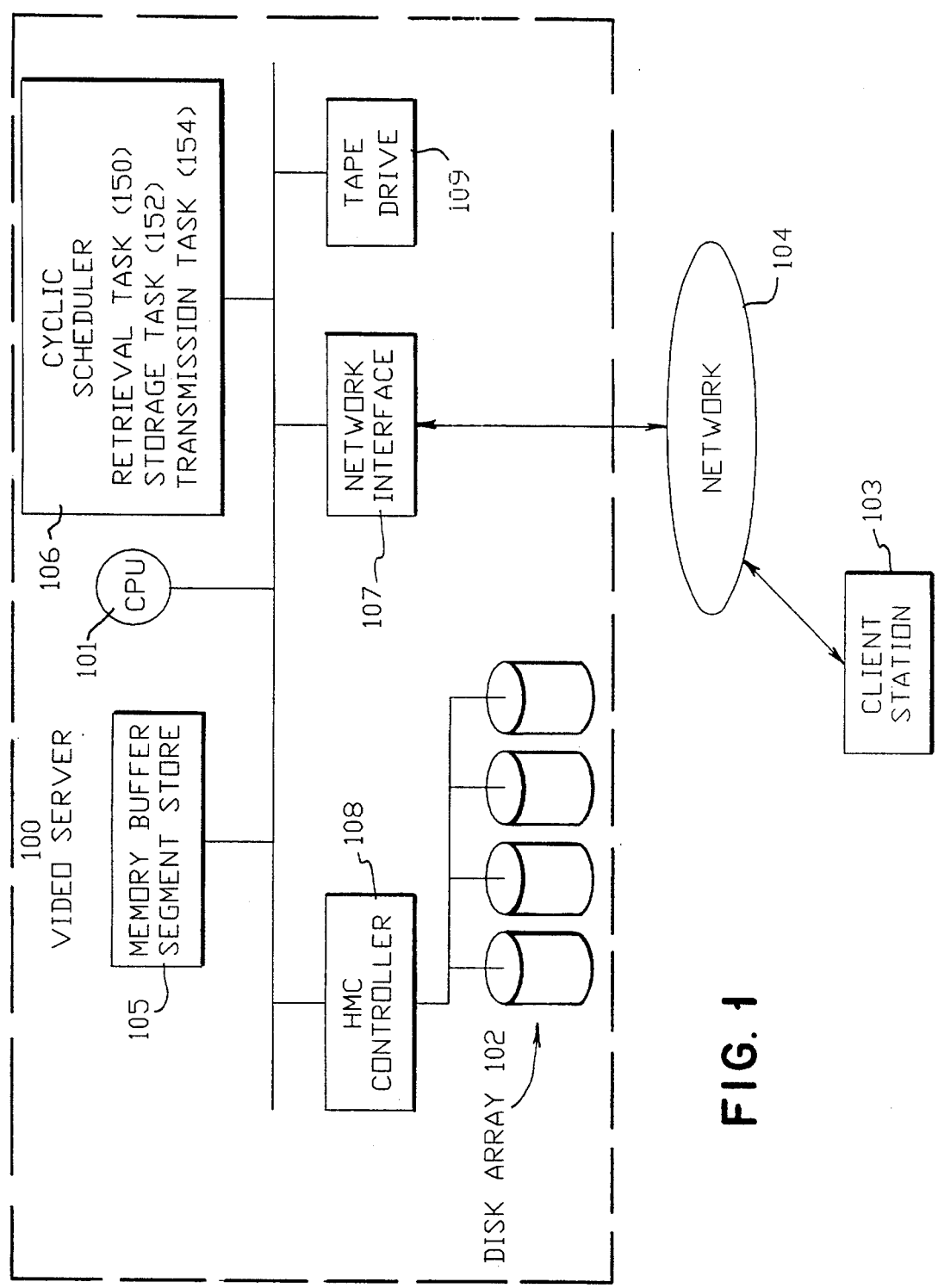
FIG. 1 shows a disk-array-based video server in a network.

FIG. 1 is a generalized block diagram example of a disk-array-based video server 100, where the video data is stored in the disk array 102 and transmitted to the end client stations 103 over the network 104 upon request. The movies (videos) are stored on the disks 102 and can be archived on tapes (which can be read by way of a tape drive 109). Under control of a system operator or software task, movies can be transferred from tape to the disk as needed. The video server 100 includes a processor (CPU) 101 which executes tasks under control of a cyclic schedular 106. These tasks include a retrieval task 150 which retrieves videos from the disks 102, a storage task 152 which stores videos temporarily in the memory buffer 105 and a transmission task 154 which transmits videos to client stations 103 by way of a communication network 104 via a network interface 107.

The video server 100 can be embodied using any processor of sufficient performance for the number of video streams to be supported. For example, a small capacity video server could be embodied using a RISC System/6000 ™ system while a larger capacity server could be embodied using an ES/9000 ™ system (both available from International Business Machines Corporation of Armonk, N.Y.). The disk array 102 can be of the RAID level 1 type. The communication network 103 can be, for example a fiber optical network or a conventional cable network. In accordance with an embodiment of the present invention, the disk array 102 is of the hybrid mirrored-and-chained type and accesses to the disk array are managed by one or more HMC controllers 108, both of which will be described in more detail below.

Figure 2:
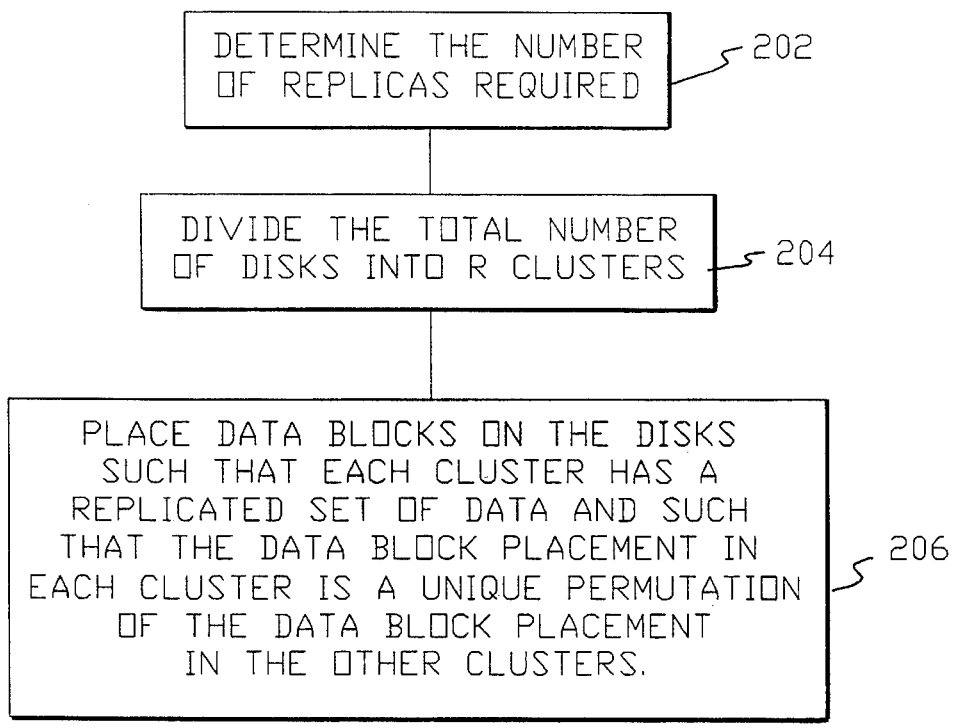
FIG. 2 is a flow diagram for the procedure to store video data in a disk array according to the HMC declustering procedure.

FIG. 2 is a flowchart of the data placement method used in the disk array 102 in FIG. 1. In the first step 202, the number of replicas required, r, based on the stream capacity and the fault-tolerance desired is determined. In the second step 204, the total number of disks is divided into r clusters. In the third step 206, data blocks of the videos are stored on the on the disks (by the disk array controller) such that each cluster has a replicated set of the data blocks and such that the data block placement in each cluster is a unique permutation of the data block placement in the other clusters.

Table 3 illustrates data placement in a disk array in accordance with a hybrid mirrored-and-chained declustering method. As in Table 1, the data blocks are labeled d0–d7, the disks are labeled 0–7. The data blocks (d0–d7) can be in any of a number of conventional encoded forms such as MPEG or H320 series.

TABLE 3

| | A double redundant disk array with hybrid mirrored-and-chained declustering | | | | | | | |
|---|---|---|---|---|---|---|---|---|
| Disk | 0 | 1 | 2 | 3 | 4 | 5 | 6 | 7 |
| d0–d3 | d0 | d1 | d2 | d3 | d0 | d1 | d2 | d3 |
| d4–d7 | d4 | d5 | d6 | d7 | d7 | d4 | d5 | d6 |

In contrast to chain declustering, HMC allows replicas and disks to be added on-line while neither having to move data around in the existing copy nor affecting the disk arm movement on existing disks. For example, when there is a need for increasing the number of replicas, a set of new disks can be added on-line to the existing disk arrays. An additional replica can then be loaded from tape and stored onto the newly installed disks. During disk installation and replica loading, services provided by the existing disk arrays and replicas are not affected because no additional I/O requests to the existing disk arrays and replicas are generated by the loading process. After the loading a replica has been completed, the new replica can immediately start servicing requests from clients. Adding a replica onto the existing disk arrays (for example to remove an old video and add a new video) can by done using the same process. With HMC, unlike chained declustering, no data movement between disks in arrays is required for the abovedescribed operations. Consequently, users can incrementally add I/O capacity and bandwidth without affecting existing services.

Figure 3:
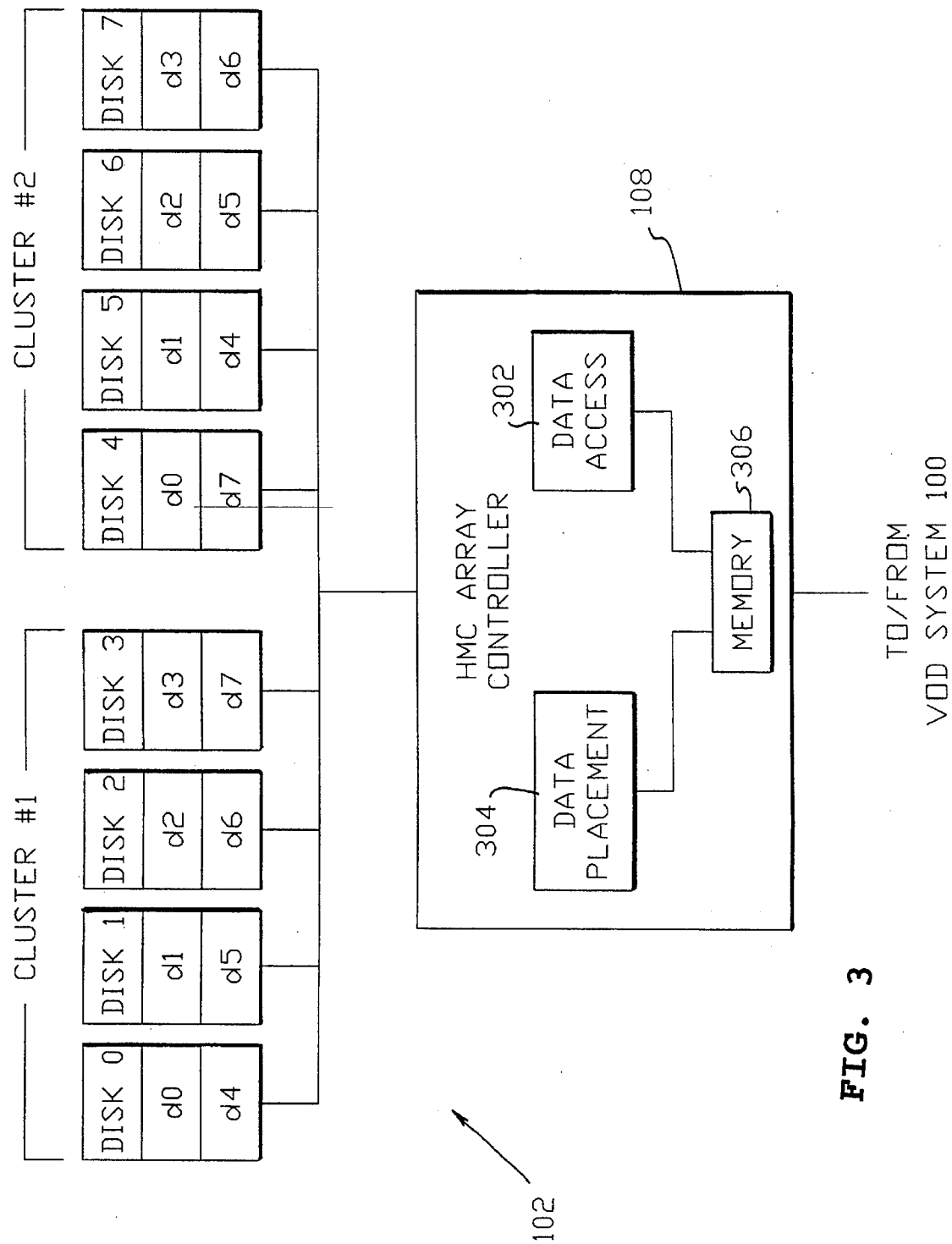
FIG. 3 is a block diagram of a hybrid mirrored-and-chained disk array and its associated controller.

FIG. 3 is a more detailed diagram of the disk array 102 of FIG. 1 and its associated controller. As shown in FIG. 3, the disk array 102 is coupled to the VOD system 100 by way of an HMC array controller 302. The HMC array controller performs the functions of a conventional RAID controller as well as those particular to the HMC array. Data access as well as data block access redirection and load rebalancing when a failed disk is detected are performed by data access controls 302 in the HMC controller. Data placement is performed by data placement controls 304. The HMC array controller 302 maintains a memory table 306 indicative of the placement of the data blocks which can be accessed by both the data placement controls 302 and the data access controls 304. Thus, the controller 302 is capable of performing the data retrieval and load balancing even in the presence of disk failures. Both the data placement controls 302 and the data access controls 304 can be embodied in microcode, hardware logic or a combination of both.

The data placement controls operate as follows. Similar to the mirrored declustering method, each data block is replicated. However, in HMC the data placement of each successive rows is offset by a fixed amount. The offset is different in different replica. In particular the data declustering method is formulated as follows: Given a set of m disks numbered 0, 1, 2, ..., rn–1, where r is the number of replicas (and thus the number of clusters), n is the size (number of disks) of a cluster, the $i^{th}$ partition of the $j^{th}$ replica is placed on the disk numbered D(i,j), where $$D(i,j)=(i+[i/n] * (j-1)) \bmod n+(j-1) * n.$$

The number r of replicas (and thus clusters) required is a function of stream capacity requirements of the disk array and desired fault-tolerance of the disk array. Assume that every disk can support L video streams. The capability of supporting multiple streams by HMC is shown in Table 4, where n is the number of disks in each cluster and r is the number of replicas required. For example, let n=4. If one wants to support 6L streams in the presence of a single disk failure, then r=2 is sufficient. On the other hand, if one wants to support 10L streams in the presence of a single disk failure, then r=3 is needed.

TABLE 4

|     | r = 2 | | r = 3 | | |
| --- | --- | --- | --- | --- | --- |
|     | normal | single failure | normal | single failure | double failures |
| HMC | 2nL | 2(n – 1)L | 3nL | (3n – 1)L | (3n – 2)L |

Figure 5:
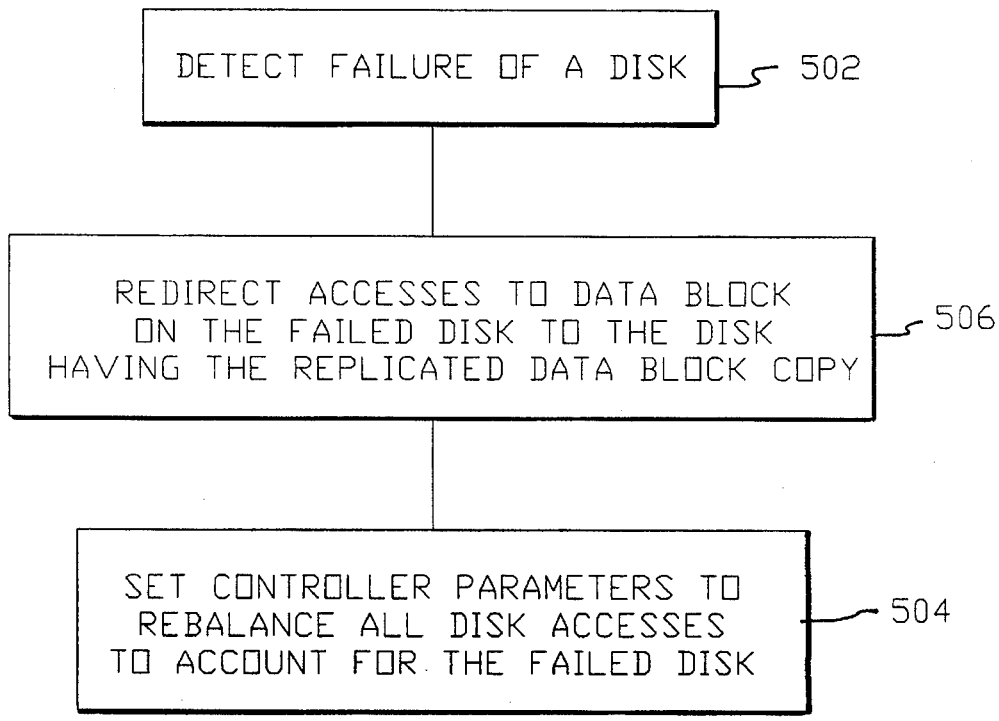

The handling of disk failures by the HMC array controller data access controls 304 is shown in FIG. 5. When the disk array controller detects a failure of a disk (in step 502), the load across the remaining disks in the array is rebalanced by (1) in step 502 redirecting all accesses to data blocks on the failed disk are redirected to the disk (referred to as the back-up disk) containing the mirrored copy (which is stored in a different cluster) and (2) in step 504, where possible (i.e. another copy exists on a working disk) redirecting a percentage of the accesses to other blocks on the back-up disk, to another disk.

In the event of a failed disk in a double redundant disk array with hybrid mirrored-and-chained declustering, the load is rebalanced as follows: Among all accesses to copy di, denote the percentage of accesses going to the physical copy of di in disk k as p(i,k). Let n be the number of disks in each cluster (e.g. n=4 in Table 3). Then, after disk f fails, the values of p(i,k), for $0 \le i \le 2n$, $0 \le k \le 2n$, and $k \ne f$, can be uniquely determined by $p(i_1,k) + p(i_2,k) = 2n/2n-1$ (where $i_1$ and $i_2$ are two different data copies stored in disk k) and $p(i,k_1)+p(i,k_2)=1$ (where $k_1$ and $k_2$ are two disks storing data copy di). As a result, the load can be balances across the disks after failure of a disk f. FIG. 4 shows accesses in a load rebalanced array for the case where disk 1 in the configuration of Table 3 (and FIG. 3) has failed. In FIG. 4, p (i,k) is indicated in front of data copy di in disk k.

For example, suppose that disk 1 in the disk array of FIG. 3 fails. Also, assume that the amount of access to each data copy is the same. Upon detection of the failure of disk 1, the controller 302 will direct all accesses for block d1 to disk 5, where the other copy of d1 is available. Further, in order to alleviate the load on disk 5, the controller also will redirect a percentage (e.g. 80%) of the accesses to data block d4 to disk 0, where the other copy of block d4 is available. As a result, the load can thus be balanced across the remaining disks in the array after the failure of disk 1.

Now that the invention has been described by way of the preferred embodiment, various modifications and improvements will occur to those of skill in the art. Thus, it should be understood that the preferred embodiment has been provided as an example and not as a limitation. The scope of the invention is defined by the appended claims.

We claim:

1. A method of distributing a set of data among a plurality of disks, comprising steps of:

dividing a total number of the disks into a plurality of clusters; and, storing blocks of the data in each cluster such that each cluster contains a complete set of the data and such that data block placement in at least some of the clusters are unique permutations of data block placement in other ones of the clusters;

wherein for given number rn of the disks numbered 0, 1, 2, ..., rn–1, where r is a number of clusters, n is a number of disks of a cluster, the $i^{th}$ partition of the $j^{th}$ replica is placed on the disk numbered d(i,j) in accordance with the relationship $d(i,j)=(i+[i/n] * (j-1)) \bmod n+(j-1) * n$.

2. A method of distributing a set of data among a plurality of disks, comprising steps of:

dividing a total number of the disks into a plurality of clusters; and, storing blocks of the data in each cluster such that each cluster contains a complete set of the data and such that data block placement in each cluster is a unique permutation of the data block placement in other ones of the clusters;

wherein, for given nurser rn of the disks numbered 0, 1, 2, ..., rn–1, where r is a number of clusters, n is a number of disks of a cluster, the $i^{th}$ partition of the $j^{th}$ replica is placed on the disk numbered d(i,j) in accordance with the relationship $d(i,j)=(i+[i/n] * (j-1)) \bmod n+(j-1) * n$.

3. A video server, comprising:

a network interface;

a disk array coupled to the network interface and having a set of movies stored thereon, each of the movies being stored as a plurality of data blocks;

a scheduler coupled to the disk array, for scheduling transmission of the movies to users, by way of the network interface; and, a disk controller coupled to the disks and the video server for controlling accesses to the disks and for rebalancing data block accesses to remaining operational disks in the disk array in the event of failure of a disk;

wherein, a complete replicated set of the movies is stored in each of a plurality of groups of the disks, each group of the disks having the data blocks placed thereon such that the data block placement in each group is a unique permutation of the data block placement in other ones of the groups.

4. The video server of claim 3 wherein the schedular schedules the movies as a function of user requests received by way of the network interface.

5. A method of storing movies in a video server of a type having a plurality of disks for storage of movies, comprising the steps of:

selecting a set of the movies to store on the disks;

placing data blocks of the movies on the disks such that each of a plurality of groups of the disks has a replicated set of the movies stored thereon and such that each group of the disks has the data blocks placed thereon such that the data block placement in each group is a unique permutation of the data block placement in other ones of the groups;

wherein, when a failure of one of the disks is detected, redirecting accesses for each data block on a failed disk to another one of the disks having a copy of the data block, and; rebalancing further access to the disks that remain operational.

6. The method of claim 5 wherein the rebalancing comprises the step of redirecting at least some access requests for data on the another one of the disks to a different disk.

7. A method of storing movies in a video server of a type having a plurality of disks for storage of movies, comprising the steps of:

selecting a set of the movies to store on the disks;

placing data blocks of the movies on the disks such that each of a plurality of groups of the disks has a replicated set of the movies stored thereon and such that each group of the disks has the data blocks placed thereon such that the data block placement in each group is a unique permutation of the data block placement in other ones of the groups;

wherein, for given number rn of the disks numbered 0, 1, 2, ..., rn−1, where r is a number of clusters, n is a number of disks of a cluster, the $i^{th}$ partition of the $j^{th}$ replica is placed on the disk numbered d(i,j) in accordance with the relationship d(i,j)=(i+[i/n] * (j−1)) mod n+(j−1) * n.

* * * * *